United States Patent [19]

Kajiwara

[11] Patent Number: 4,698,495

[45] Date of Patent: Oct. 6, 1987

[54] AMORPHOUS SILICON PHOTO-SENSOR FOR A CONTACT TYPE IMAGE SENSOR

[75] Inventor: Yuji Kajiwara, Tokyo, Japan

[73] Assignee: NEC Corporation, Tokyo, Japan

[21] Appl. No.: 8,108

[22] Filed: Jan. 23, 1987

Related U.S. Application Data

[63] Continuation of Ser. No. 743,840, Jun. 12, 1985, abandoned.

[30] Foreign Application Priority Data

Jun. 12, 1984 [JP]  Japan ................................ 59-120410
Jun. 12, 1984 [JP]  Japan ................................ 59-120411

[51] Int. Cl.⁴ ............................................. H01J 40/14
[52] U.S. Cl. .................................... 250/211 R; 357/2; 357/30
[58] Field of Search ............... 250/211 R, 211 J, 578; 357/2, 30 K, 31, 32

[56] References Cited

U.S. PATENT DOCUMENTS

| | | | |
|---|---|---|---|
| 3,681,765 | 8/1972 | Chapman | 250/211 R |
| 3,792,258 | 2/1974 | Sliker | 250/211 J |
| 3,988,613 | 10/1976 | Brown et al. | 250/211 R |
| 4,453,184 | 6/1984 | Hamakawa et al. | 358/213 |
| 4,471,228 | 9/1984 | Nishizawa et al. | 250/578 |
| 4,499,384 | 2/1985 | Segawa et al. | 250/211 J |
| 4,565,928 | 1/1986 | Yamamoto et al. | 250/578 |

FOREIGN PATENT DOCUMENTS 0100771  6/1982  Japan ................................... 357/2

Primary Examiner—David C. Nelms
Assistant Examiner—William L. Oen
Attorney, Agent, or Firm—Sughrue, Mion, Zinn, Macpeak & Seas

[57] ABSTRACT

The contact type image sensor includes a transparent insulator substrate, a common electrode formed on a main surface of the insulator substrate, an amorphous silicon layer formed on the common electrode, a plurality of individual electrodes formed on the amorphous silicon layer, an insulator layer covering the amorphous silicon layer and having openings at the portions of the individual electrodes, and a plurality of wiring layers formed on the insulator layer for leading out the output signal in response to the light introduced from a back surface of the insulator substrate. A photo-shield layer may be interposed between the common electrode and the amorphous silicon layer.

4 Claims, 3 Drawing Figures

AMORPHOUS SILICON PHOTO-SENSOR FOR A CONTACT TYPE IMAGE SENSOR

This is a continuation of application Ser. No. 743,840, filed June 12, 1985, now abandoned.

BACKGROUND OF THE INVENTION

1. Field of the Invention

This invention relates to a photo-sensor array for a contact type linear image sensor, and more particularly to a photo-sensor array formed on one surface of a transparent substrate and introducing image light from the opposite surface of the transparent substrate.

2. Description of the Prior Art

In recent years, a contact type image sensor has been developed for facsimile equipment. The contact type image sensor detects images by being directly contacted with the document to be sensed. This means that no lens system is required, resulting in a compact and adjustment-free sensing system.

One such contact type image sensor was reported at the 76th meeting of the Institute of Image Electronics Engineering of Japan (Nov. 21, 1983, No. 83-04-01) under the title "High Speed Amorphous Silicon Contact Type Image Sensor". The image sensor was formed on a transparent insulator substrate. A photo-shield layer having windows for introducing the light to be sensed was formed on one surface of the insulator substrate. A $SiO_2$ layer was deposited over the photo-shield layer and the exposed surface of the insulator substrate. A common electrode made of a transparent conductor was formed on the limited surface of the $SiO_2$ layer. Then, an amorphous silicon layer was formed on the transparent conductor and the exposed portion of the $SiO_2$ layer. Finally, a plurality of individual electrodes were formed on the amorphous silicon layer and extended onto the exposed surface of the $SiO_2$ layer. Good performance was reported.

However, a considerable leakage current has been observed with this structure according to the inventor's experiments. The inventor has newly found that this leakage current is due to defects in the amorphous silicon layer between the common electrode and the individual electrodes, such as cracks and pin-holes. The lack of flatness of the surface of the $SiO_2$ layer causes the defects in the amorphous silicon layer. This lack of flatness is due to the existance of the common electrode and the photo-shield layer on the transparent insulator substrate. Particularly, the conventional structure has a wide overlap between the common and individual electrodes. In the overlapped area, a hollow exists on the surface of the $SiO_2$ layer upon the window of the photo-shield layer. Many defects are generated in the amorphous silicon at the periphery of the hollow, which cause a leakage current between the common and individual electrodes. Thus, the contact type image sensor of the prior art has a large dark current in the imaging output signal.

The aforementioned defects in the amorphous silicon may be overcome to a degree by decreasing the thicknesses of the photo-shield layer and the common electrode. However, a thin photo-shield layer renders the photo-shield effect imperfect, and a thin common electrode produces a high parasitic resistance. Both of these characteristics deteriorate the photo-sensing performance.

Another drawback of the prior art structure is the complex manufacturing process required. Processes for forming the photo-shield layer, the $SiO_2$ layer and the common electrode are necessary, before the formation of the amorphous silicon layer. Such formation of multiple layers causes contamination in particularly amorphous silicon layer. The surface contamination causes crystal defects in the amorphous silicon layer formed thereon. To avoid such contamination, careful processing is necessary, resulting in low productivity and high production costs.

SUMMARY OF THE INVENTION

The primary object of the present invention is to provide a contact type image sensor producing only a small leakage current and having a simple structure.

According to the present invention, there is provided a contact type image sensor comprising a transparent insulator substrate, a transparent common electrode formed on the substrate, an amorphous silicon layer formed on a limited part of the common electrode, a plurality of individual electrodes formed on the amorphous silicon layer, each individual electrode having an area corresponding to a sensing element, an insulator layer covering the amorphous silicon layer and having apertures exposing the individual electrodes, and wiring layers for leading out the individual electrodes through the apertures, the wiring layers being in contact with the individual electrodes and extending over the insulator layer.

The contact type image sensor of the present invention interposes only the common electrode between the amorphous silicon layer and the transparent insulator substrate. There is no lack of flatness of the surface on which the amorphous silicon layer is formed except at the edge of the common electrode, which may be positioned far from the individual electrodes. Thus, the amorphous silicon layer under the individual electrodes is kept flat and uniform. Defects such as cracks and pin-holes in the amorphous silicon layer may be kept away from the sensing element regions under the individual electrodes. Furthermore, the amorphous silicon layer at the defect area is covered with an insulator film. Therefore, the leakage current between the common electrode and individual electrodes is very small. The above-mentioned effect is similarly obtained if the common electrode is made thick. Thus, the parasitic resistance of the common electrode can be sufficiently lowered without increasing the leakage current.

Only the common electrode is formed before the formation of the amorphous silicon layer. Accordingly, there is little contamination of the amorphous silicon layer. Thus, an amorphous silicon layer having less crystal defects is easily obtained, resulting in high productivity at low cost.

BRIEF DESCRIPTION OF THE DRAWINGS

The above and further objects, features and advantages of the present invention will become more apparent from the following detailed description taken in conjunction with the accompanying drawings, wherein.

Figure 1:
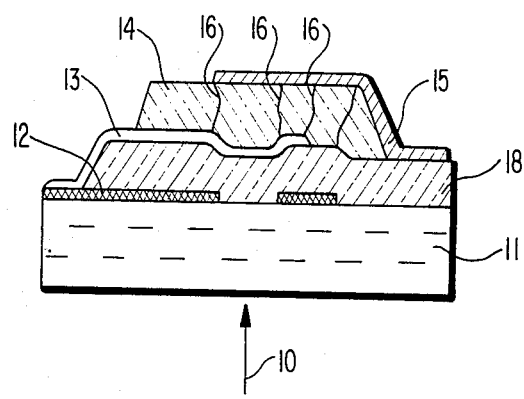
FIG. 1 is a sectional view of a contact type image sensor of the prior art.

The contact type image sensor of the prior art is formed on a transparent insulator substrate 11. The light 10 to be sensed is introduced from the bottom surface of the insulator substrate 11. On the upper surface of the insulator substrate 11, a photo-shield layer 12 having windows at sensing element regions is formed. A $SiO_2$ layer 18 is formed on the exposed surface of the insulator substrate 11 and covers a portion of the photo-shield layer 12 around the windows. A common electrode 13 of a transparent conductor such as ITO (indium tin oxide) is formed on the exposed part of the photo-shield layer 12 and a part of the surface of the $SiO_2$ layer 18 which includes the surface above the windows of photo-shield layer 12. Amorphous silicon layer 14 is then formed on a part of the common electrode 13 above the windows and a part of the $SiO_2$ layer 18 continuous with the common electrode 13. On the upper surface of the amorphous silicon 14, a plurality of individual electrodes 15 are formed. The individual electrodes cover the portions above the windows and extend to the exposed portion of the $SiO_2$ layer 18.

The surface on which the amorphous silicon 14 is formed has many steps at the edges of the photo-shield layer 12, the windows and the common electrode 13. At the steps, many defects 16 such as cracks and pin-holes are produced. The area of overlap between the common electrode 13 and the individual electrodes 15 is wide and many defects 16 exist in the overlapped area. These defects in the overlapped area produce a leakage current between the common electrode 13 and the individual electrodes 15, causing the large dark current of the image sensor.

The unevenness of the surface on which the amorphous silicon layer 14 is formed may be improved by decreasing the thicknesses of the photo-shield layer 12 and/or the common electrode 13. However, a thin photo-shield layer 12 has less of a photo-shielding effect, resulting in an increase in the dark current of the image sensor. A thin common electrode 13 is accompanied by a large parasitic resistance by which external noise easily affects the image output signal.

From the view point of manufacture, the prior art arrangement first requires the formation of the photo-shield layer 12, the $SiO_2$ layer 18 and the common electrode 13. The formation of such multiple layers before the formation of the amorphous silicon layer 14 is a cause of contamination of the surface on which the amorphous silicon layer 14 is formed. The contamination causes defects crystal defect in the amorphous silicon layer.

DESCRIPTION OF THE PREFERRED EMBODIMENTS

Figure 2:
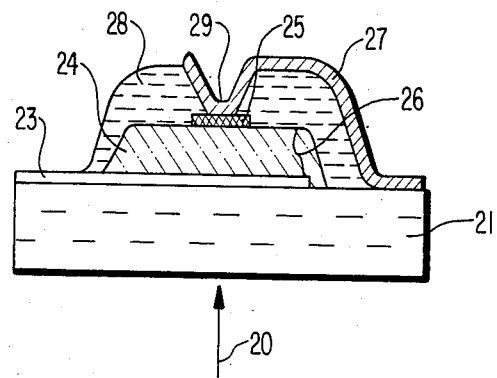
FIG. 2 is a sectional view of a contact type image sensor according to a first embodiment of the present invention.

The first embodiment of the invention change is shown in FIG. 2. A glass is used as a transparent substrate 21. Light 20 to be sensed is introduced from the bottom surface of the substrate 21. A common electrode 23 made of a transparent conductor such as $SnO_2$ or ITO and having a thickness of several hundred angstroms is formed on the substrate 21. Amorphous silicon layer 24 having a thickness of 1 to 2 $\mu m$ is deposited as a photo-sensitive material so as to cover a predetermined part of the common electrode 23 and the adjacent surface of the substrate 21. A plurality of individual electrodes 25, each having an area of 0.01 $mm^2$ in the case of a photo sensor having a resolution of eight picture elements per millimeter, are formed on the amorphous silicon layer 24. The individual electrodes 25 are made of Cr, Ni-Cr, Al, Ta and so on. The amorphous silicon layer 24 is then covered with an insulator layer 28 having openings 29 at the individual electrodes 25. The insulator layer 28 is formed by hardening an insulating resin. Finally, wiring layers 27 of Al or Cr-Au are formed on the individual electrodes 25 and the insulator layer 28 to connect the respective individual electrodes 25 with a driving circuit (not shown) which may be formed on the same substrate 21 or in a separate integrated circuit device.

The principal and large part of the amorphous silicon layer 24 is formed on the flat surface of the common electrode 23. The individual electrodes 25 are formed on the amorphous silicon layer 24 at this flat surface. Therefore, the sensor element regions of the amorphous silicon layer 24 which are in contact with the individual electrodes 25 have less defects. Only at the edge of the common electrode 23 are defects 26 such as cracks and pinholes produced in the amorphous silicon layer 24. However, the amorphous silicon layer 24 at the edge of the common electrode 23 does not contact the wiring layers 27. The defects 26 do not cause any leakage current between the common electrode 23 and the individual electrodes 25. Thus, the image sensor of the first embodiment has only a very small dark current and obtains an imaging output of high S/N ratio. Such dark current may be further decreased by positioning the edge of the common electrode 23 far from the individual electrodes 25. Since the sensing element regions are defined by the individual electrodes 25, it is easy to widely separate the individual electrodes 25 and the edge of the common electrode 23.

If the thickness of the common electrode 23 is increased, a small leakage current is similarly achieved by positioning the edge of the common electrode 23 far from the individual electrodes 25. Thus, the parasitic resistance accompanying a thin common electrode 23 can be decreased by using a thick common electrode 23. Therefore, an image sensor which is hardly affected by external noise can be obtained.

Furthermore, only the common electrode 23 is interposed between the substrate 21 and the amorphous layer 24. Therefore, the surface contamination before the formation of the amorphous layer 24 is very slight. The amorphous silicon layer 24 formed thereon has very few and small crystal defects. Thus, a wide area nondefective amorphous layer 24 is easily formed.

Figure 3:
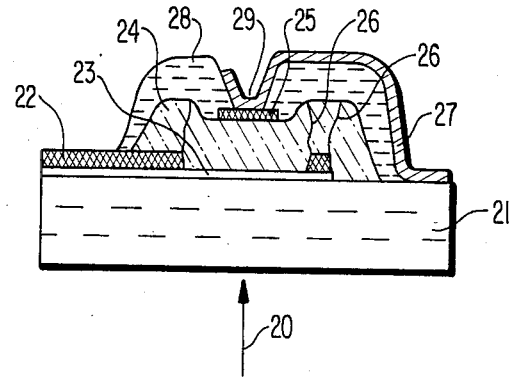
FIG. 3 is a sectional view of a contact type image sensor according to a second embodiment of the present invention.

According to the second embodiment of the present invention shown in FIG. 3, a photo-shield layer 22 of Cr having a thickness of more than 1,000 Å, preferably 2,000 Å, is formed on the common electrode 23. The photo-shield layer 22 has a plurality of windows which position under the individual electrodes 25 and which have an area wider than the individual electrodes 25. The amorphous silicon layer 24 is deposited on the photo-shield layer 22 to fill the windows. Then, the surface of the amorphous silicon layer 24 has a hollow around the individual electrodes 25.

The amorphous silicon layer 24 of the second embodiment produces defects 26 at the edges of the windows in the photo-shield layer 22 and at the edge of the common electrode 23. However, since the amorphous silicon layer 24 located under the individual electrodes 25 is kept uniformly flat, the defects 26 in the amorphous silicon layer 24 do not reach the individual electrodes 25. Thus, no leakage current due to the defects 26 occurs, similarly to the first embodiment shown in FIG. 2.

The photo-shield layer 22 can be made thick without increasing the leakage current by using wide windows. Thus, a more perfect photo-shielding effect can be obtained. The thickness of the common electrode 23 can be similarly increased without increasing the number of defects in the amorphous silicon layer 24. The surface contamination of the surface on which the amorphous silicon layer 24 is formed is slightly increased, compared with the first embodiment, but is still very slight, compared with the image sensor of the prior art.

In the first and second embodiments, the driving circuit may be formed on the same substrate 21 before the formation of insulator layer 28 and may be connected with the individual electrodes 25 via the wiring layer 27. The wiring layer 27 may be formed by selectively etching an evaporated Al layer or by selectively painting the conductive path using a screening method. Furthermore, the arrangement of the common electrode 23 and the wiring layers 27 may be modified. For example, the wirings 27 may be alternatively lead out on both sides of the line of individual electrodes 25 with an arrangement where the common electrode 23 is lead out in the same direction as the line of individual electrodes 25. With such an arrangement, higher integration density can be achieved.

What is claimed is:

1. An image sensor comprising a transparent insulator substrate, a common electrode formed on one surface of said insulator substrate, said common electrode being made of a transparent conductor, an amorphous semiconductor layer formed on said common electrode, an individual electrode formed on said amorphous semiconductor layer, an insulator layer covering said amorphous semiconductor layer and a periphery of said individual electrode, said insulator layer having an opening on a central portion of said individual electrode, and a wiring layer formed on said insulator layer, said wiring layer contacting said central portion of said individual electrode through said opening.

2. An image sensor as claimed in claim 1, wherein said amorphous semiconductor layer is made of amorphous silicon.

3. An image sensor as claimed in claim 2, wherein said image sensor receives light to be sensed through said insulator substrate beneath said individual electrode.

4. An image sensor, comprising; a transparent insulator substrate, a common electrode formed on one surface of said insulator substrate, said common electrode comprising a transparent conductor, a photo-shield layer formed on said common electrode except for one part of said common electrode, an amorphous semiconductor layer formed continuously over said photo-shield layer and on said one part of said common electrode, an individual electrode formed on that part of said amorphous semiconductor layer located on said one part of said common electrode, said individual electrode having an area smaller than said one part of said common electrode, an insulator layer covering said amorphous semiconductor layer and a periphery of said individual electrode, said insulator layer having an opening at a central portion of said individual electrode, and a wiring layer formed on said insulator layer, said wiring layer contacting said central portion of said individual electrode through said opening in said insulator layer.

* * * * *

UNITED STATES PATENT AND TRADEMARK OFFICE
CERTIFICATE OF CORRECTION

PATENT NO. : 4,698,495

DATED : October 6, 1987

INVENTOR(S) : Yuji Kajiwara

It is certified that error appears in the above-identified patent and that said Letters Patent is hereby corrected as shown below:

Column 2, line 6, delete "particulary" and insert --the--;

Column 2, line 7, delete "The", insert --particularly--.

Column 3, line 51, delete "The", insert --This--.

Signed and Sealed this

Sixteenth Day of August, 1988

Attest:

DONALD J. QUIGG

Attesting Officer

Commissioner of Patents and Trademarks